(12) United States Patent
Chou et al.

(10) Patent No.: US 10,266,391 B2
(45) Date of Patent: Apr. 23, 2019

(54) MICROELECTROMECHANICAL SYSTEM DEVICE

(71) Applicant: MiraMEMS Sensing Technology Co., Ltd, Suzhou (CN)

(72) Inventors: I-Heng Chou, Hsinchu (TW); Li-Tien Tseng, Taoyuan (TW); Chih-Liang Kuo, Hsinchu (TW)

(73) Assignee: MIRAMEMS SENSING TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 15/877,952

(22) Filed: Jan. 23, 2018

(65) Prior Publication Data

US 2018/0208457 A1 Jul. 26, 2018

(30) Foreign Application Priority Data

Jan. 24, 2017 (CN) .......................... 2017 1 0059828

(51) Int. Cl.
*B81B 7/00* (2006.01)
*B81B 3/00* (2006.01)
*B81C 1/00* (2006.01)

(52) U.S. Cl.
CPC .......... *B81B 7/0006* (2013.01); *B81B 3/0018* (2013.01); *B81B 3/0021* (2013.01); *B81B 7/0032* (2013.01); *B81C 1/0015* (2013.01); *B81C 1/0023* (2013.01); *B81C 1/00134* (2013.01); *B81C 1/00158* (2013.01); *B81C 1/00182* (2013.01); *B81B 2201/0264* (2013.01); *B81C 2203/0792* (2013.01)

(58) Field of Classification Search
None
See application file for complete search history.

(56) References Cited

U.S. PATENT DOCUMENTS

| | | | |
|---|---|---|---|
| 2015/0197419 A1* | 7/2015 | Cheng | B81B 7/0006 257/418 |
| 2015/0274515 A1* | 10/2015 | Bowles | B81B 7/02 257/415 |
| 2017/0250171 A1* | 8/2017 | Yu | H01L 25/50 |
| 2018/0111823 A1* | 4/2018 | Nunan | B81B 7/0006 |

* cited by examiner

*Primary Examiner* — Minh Loan Tran
(74) *Attorney, Agent, or Firm* — Muncy, Geissler, Olds & Lowe, P.C.

(57) ABSTRACT

A microelectromechanical system (MEMS) device includes a processing die, a MEMS die and a plurality of wires. The MEMS die includes a substrate and a MEMS element. The substrate has a first surface, and the first surface includes a circuit and a plurality of first conductive contacts electrically connected with the circuit. The MEMS element has a second surface, a third surface and at least one second conductive contact, wherein the MEMS element is disposed on the first surface of the substrate with the second surface facing the substrate, and the at least one second conductive contact is disposed on the third surface of the MEMS element. The wires electrically connect the substrate and the MEMS element of the MEMS die to the processing die through the first conductive contacts and the second conductive contact respectively.

8 Claims, 2 Drawing Sheets

US 10,266,391 B2

MICROELECTROMECHANICAL SYSTEM DEVICE

BACKGROUND OF THE INVENTION

1. Field of the Invention

The present invention relates to a microelectromechanical system (MEMS) device, and more particularly to a MEMS device electrically connected to an external chip through wires.

2. Description of the Prior Art

Since 1970s when the concept of the MEMS (Microelectromechanical System) device had formed, the MEMS device has progress from the laboratory exploring object to becoming an object integrated with a high order system. Also, it has wide applications in the popular consumer devices and exhibits amazing and stable growth. The MEMS device includes a movable MEMS element, and various functions of the MEMS device can be realized by sensing the capacitance differences caused by the physical quantities of the movement of the movable MEMS element.

The prior-art MEMS device has the movable MEMS element disposed on a semiconductor substrate, and the MEMS element is electrically connected to the semiconductor substrate through conductive through holes. Finally, the MEMS element is electrically connected to an external chip through conductive contacts of the semiconductor substrate. However, the above-mentioned structure will increase the semiconductor processes of the MEMS element, which leads to an increase of the manufacturing cost of the MEMS device. For this reason, how to simplify the processes of the MEMS device is the most important goal for now.

SUMMARY OF THE INVENTION

The present invention is directed to provide a microelectromechanical system (MEMS) device which electrically connects a MEMS element to an external chip through wires, and therefore the semiconductor processes for electrically connecting the MEMS element to the conductive through holes of a semiconductor substrate may be avoided, so as to reduce the manufacturing cost of the MEMS device.

A MEMS device of one embodiment of the present invention includes a processing die, a MEMS die and a plurality of wires. The MEMS die includes a substrate and a MEMS element. The substrate has a first surface, and the first surface includes a circuit and a plurality of first conductive contacts electrically connected with the circuit. The MEMS element has a second surface, a third surface and at least one second conductive contact, wherein the MEMS element is disposed on the first surface of the substrate with the second surface facing the substrate, and the at least one second conductive contact is disposed on the third surface of the MEMS element. The wires electrically connect the substrate and the MEMS element of the MEMS die to the processing die through the first conductive contacts and the at least one second conductive contact.

The objective, technologies, features and advantages of the present invention will become apparent from the following description in conjunction with the accompanying drawings wherein certain embodiments of the present invention are set forth by way of illustration and example.

DESCRIPTION OF THE PREFERRED EMBODIMENT

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided, however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
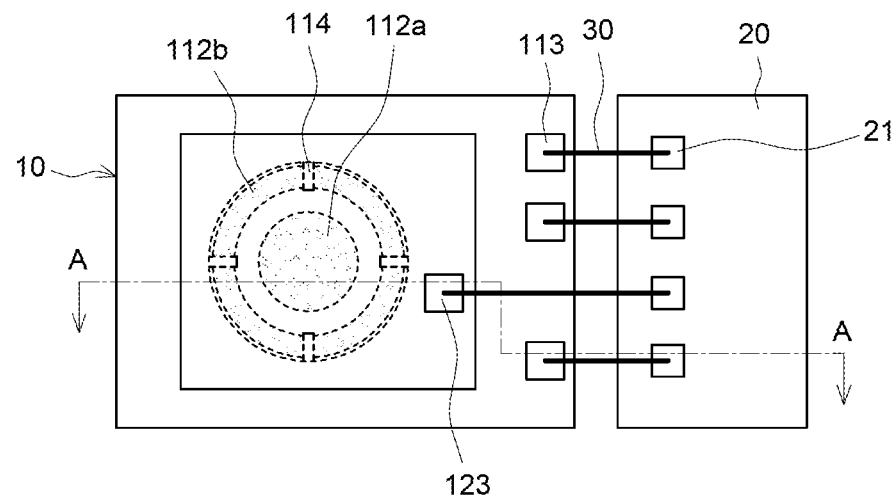
FIG. 1 is a top view, showing a MEMS device of a first embodiment of the present invention.
Figure 2:
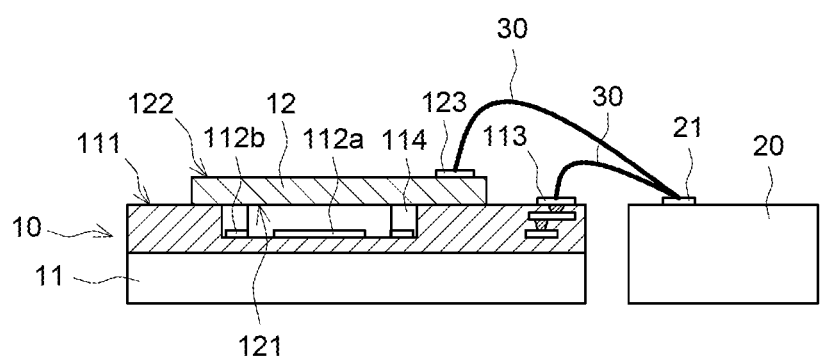
FIG. 2 is a schematic view, showing a sectional structure of the MEMS device of the first embodiment of the present invention along the line AA in FIG. 1.

Referring to FIG. 1 and FIG. 2, a microelectromechanical system (MEMS) device of one embodiment of the present invention includes a MEMS die 10 and a processing die 20. The processing die 20 is electrically connected to the MEMS die 10 through a plurality of wires 30, so as to process a sensing signal output by the MEMS die 10. In one embodiment, the processing die 20 may be an Application specific integrated circuit (ASIC).

The MEMS die 10 includes a substrate 11 and a MEMS element 12. A first surface 111 of the substrate 11 includes a circuit and a plurality of first conductive contacts 113 electrically connected with the circuit. For example, the substrate 11 includes at least one metal layer. In the embodiment shown in FIG. 2, the substrate 11 includes a circuit formed by a plurality of metal layers, and the top metal layer is partially exposed through the first surface 111 of the substrate 11. The exposed metal layer may be used as a sensing electrode 112a of a sensing capacitor and a reference electrode 112b of a reference capacitor. It may be understood that the first conductive contacts 113 may be electrically connected to the sensing electrode 112a and the reference electrode 112b through interconnection lines. In one embodiment, the substrate 11 may be a complementary metal-oxide-semiconductor substrate.

The MEMS element 12 has a second surface 121, a third surface 122 and at least one second conductive contact 123. The MEMS element 12 is disposed on the first surface 111 of the substrate 11 with the second surface 121 facing the substrate 11. The at least one second conductive contact 123 is disposed on the third surface 122 of the MEMS element 12. In one embodiment, the MEMS element 12 may be jointed with the substrate 11 by the eutectic bonding technology. For example, a joint between the substrate 11 and the MEMS element 12 includes an alloy, which includes at least one of aluminum, copper, germanium, indium, gold and silicon. The foregoing description is not a limitation, and the MEMS element 12 may be jointed with the substrate 11 by at least one of the fusion bonding, welding and adhering binding technologies. In one embodiment, the MEMS element 12 may be a single crystalline silicon.

For example, firstly, a single crystalline silicon substrate may be jointed with the substrate 11 by one of the eutectic bonding, fusion bonding, welding or adhering binding technologies. Then, at least one second conductive contact 123 may be formed on the third surface 122 of the single crystalline silicon substrate by appropriate semiconductor processes, such as deposition, exposure, development and etching, etc. Finally, the single crystalline silicon substrate may be formed into the MEMS element 12 by semiconductor processes. A plurality of wires 30 may connect the first conductive contacts 113 on the substrate 11 and the at least one second conductive contact 123 on the MEMS element 12 to the conductive contacts 21 on the processing die 20, so as to electrically connect the substrate 11 and the MEMS element 12 of the MEMS die 10 to the processing die 20.

Taking the pressure sensor shown in FIG. 1 and FIG. 2 as an example, the MEMS element 12 and the substrate 11 form an airtight cavity, and the MEMS element 12 is opposite to the sensing electrode 112a. Based on this structure, the MEMS element 12 may deform as a function of the pressure of the external environment, so as to lead to a change of the capacitance between the MEMS element 12 and the sensing electrode 112a, and therefore, the pressure change of the external environment may be sensed. It should be noted that the second conductive contact 123 is not electrically connected with the circuit on the substrate 11 through the MEMS element 12. In other words, the MEMS device of the present invention does not need conductive through holes formed in the MEMS element 12 or other similar structure, so that a plurality of semiconductor processes may be omitted and the manufacturing cost of the MEMS device may be reduced.

Figure 3:
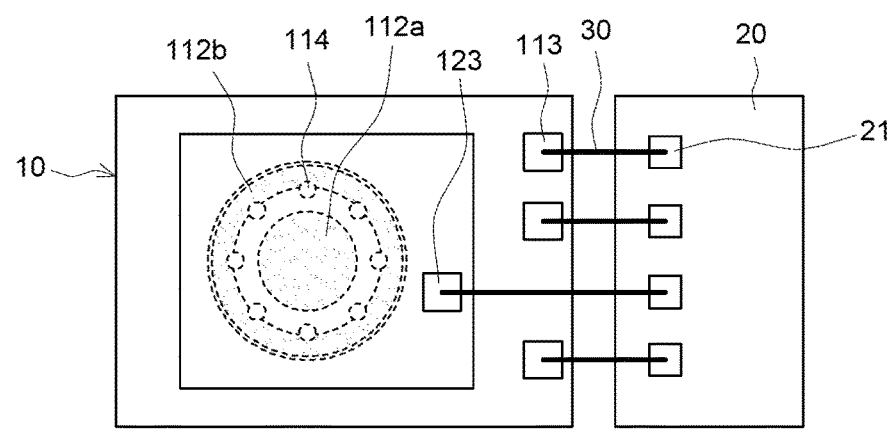
FIG. 3 is a schematic view, showing a MEMS device of a second embodiment of the present invention.
Figure 4:
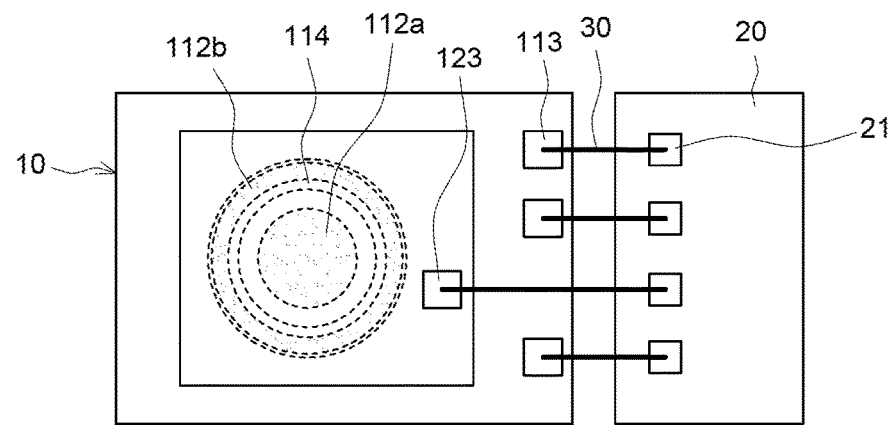
FIG. 4 is a schematic view, showing a MEMS device of a third embodiment of the present invention.
Figure 5:
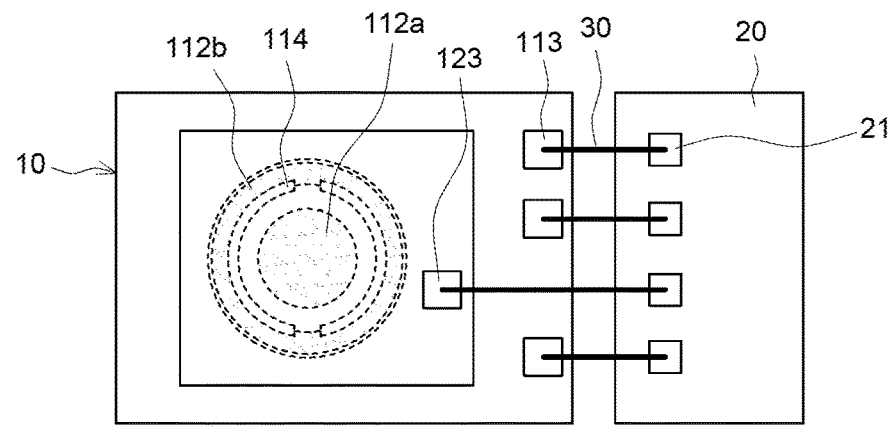
FIG. 5 is a schematic view, showing a MEMS device of a fourth embodiment of the present invention.

It may be understood that the reference electrode 112b is disposed near a side wall of the airtight cavity, and an area of the MEMS element 12 corresponding to the reference electrode 112b may maintain a constant spacing with the reference electrode 112b due to the support of the side wall of the airtight cavity. As a result, the spacing between the reference electrode 112b and the MEMS element 12 is almost constant. In other words, a reference capacitor having a constant capacitance may be formed between the reference electrode 112b and the MEMS element 12. In one embodiment, the MEMS die 10 further includes a supporting element 114 disposed near the side wall of the airtight cavity to maintain the spacing between the reference electrode 112b and the MEMS element 12 as a constant spacing. In the embodiment shown in FIG. 1, the supporting element 114 has a wall shape, which is not a limitation. The supporting element 114 may have a pillar shape (as shown in FIG. 3), annular shape (as shown in FIG. 4) or arc shape (as shown in FIG. 5) or other appropriate structure as well.

To sum up the foregoing descriptions, the MEMS device of the present invention electrically connects the MEMS element to the processing die directly through wires, so that no conductive through holes or similar conductive structures are needed to be formed in the MEMS element, and thus, the semiconductor processes may be simplified and the manufacturing cost of the MEMS device may be reduced.

What is claimed is:

1. A microelectromechanical system device comprising:
a processing die;
a microelectromechanical system die comprising:
a substrate having a first surface, wherein the first surface comprises a circuit and a plurality of first conductive contacts electrically connected with the circuit; and
a microelectromechanical system element having a second surface, a third surface and at least one second conductive contact, wherein the microelectromechanical system element is disposed on the first surface of the substrate with the second surface facing the substrate, and the at least one second conductive contact is disposed on the third surface of the microelectromechanical system element; and
a plurality of wires electrically connecting the substrate and the microelectromechanical system element of the microelectromechanical system die to the processing die through the a plurality of first conductive contacts and the at least one second conductive contact.

2. The microelectromechanical system device according to claim 1, wherein the substrate includes a complementary metal-oxide-semiconductor substrate.

3. The microelectromechanical system device according to claim 1, wherein the microelectromechanical system element includes a single crystalline silicon.

4. The microelectromechanical system device according to claim 1, wherein an airtight cavity is formed between the microelectromechanical system element and the substrate, such that the microelectromechanical system device serves as a pressure sensor.

5. The microelectromechanical system device according to claim 4, wherein the microelectromechanical system die further comprises a supporting element disposed near a side wall of the airtight cavity.

6. The microelectromechanical system device according to claim 5, wherein the supporting element has a wall shape, pillar shape, annular shape or arc shape.

7. The microelectromechanical system device according to claim 1, wherein a joint between the substrate and the microelectromechanical system element is implemented by at least one of the eutectic bonding, fusion bonding, welding and adhering binding.

8. The microelectromechanical system device according to claim 1, wherein the processing die is an application specific integrated circuit (ASIC).

* * * * *